United States Patent
Nishiyama (10) Patent No.: US 7,455,213 B2
(45) Date of Patent: Nov. 25, 2008

(54) APPARATUS FOR MANUFACTURING SEMICONDUCTOR DEVICES, METHOD OF MANUFACTURING THE SEMICONDUCTOR DEVICES, AND SEMICONDUCTOR DEVICE MANUFACTURED BY THE APPARATUS AND METHOD

(75) Inventor: Yoshihide Nishiyama, Chino (JP)

(73) Assignee: Seiko Epson Corporation (JP)

( * ) Notice: Subject to any disclaimer, the term of this patent is extended or adjusted under 35 U.S.C. 154(b) by 596 days.

(21) Appl. No.: 10/957,429

(22) Filed: Oct. 1, 2004

(65) Prior Publication Data

US 2005/0112844 A1 May 26, 2005

(30) Foreign Application Priority Data

Oct. 2, 2003 (JP) .............................. 2003-344516

(51) Int. Cl.
*B23K 31/02* (2006.01)
(52) U.S. Cl. .................... 228/180.22; 228/223
(58) Field of Classification Search ........................ None
See application file for complete search history.

(56) References Cited

U.S. PATENT DOCUMENTS

| | | | | |
|---|---|---|---|---|
| 3,868,764 | A * | 3/1975 | Hartleroad et al. ....... | 228/123.1 |
| 3,906,621 | A * | 9/1975 | Epple ........................... | 29/827 |
| 3,908,075 | A * | 9/1975 | Jackson et al. .............. | 428/133 |
| 3,942,245 | A * | 3/1976 | Jackson et al. ................ | 29/827 |
| 4,371,912 | A * | 2/1983 | Guzik ......................... | 361/684 |
| 6,213,376 | B1 * | 4/2001 | Correia et al. .............. | 228/44.7 |
| 6,279,815 | B1 * | 8/2001 | Correia et al. .......... | 228/180.21 |
| 6,708,862 | B2 * | 3/2004 | Fujii et al. .................... | 228/6.2 |

FOREIGN PATENT DOCUMENTS

| | | |
|---|---|---|
| JP | 58-060937 | 4/1983 |
| JP | 63-086551 | 4/1988 |
| JP | 05-090339 | 4/1993 |
| JP | 11-097839 | 4/1999 |
| JP | 11-274202 | 10/1999 |
| JP | 2001-035871 | 2/2001 |
| JP | 2002-064135 | 2/2002 |

OTHER PUBLICATIONS

Communication from Japanese Patent Office regarding related application.

* cited by examiner

*Primary Examiner*—Kiley Stoner
(74) *Attorney, Agent, or Firm*—Harness, Dickey & Pierce, P.L.C.

(57) ABSTRACT

An apparatus 10A for manufacturing semiconductor devices includes a plurality of receiving portions 12 for receiving an upper semiconductor package 30 on a top surface of the receiving portion 12. The receiving portion has a function of restricting the movement of the upper semiconductor package 30 in a direction parallel to a top surface of the upper semiconductor package 30. The receiving portion 12 is a concave portion in which the upper semiconductor package 30 is adapted to be received. An adhesive material having a function of immovably holding the upper semiconductor package 30 to the receiving portion 12 may be provided within the receiving portion 12, for example.

3 Claims, 10 Drawing Sheets

APPARATUS FOR MANUFACTURING SEMICONDUCTOR DEVICES, METHOD OF MANUFACTURING THE SEMICONDUCTOR DEVICES, AND SEMICONDUCTOR DEVICE MANUFACTURED BY THE APPARATUS AND METHOD

CROSS-REFERENCE TO RELATED APPLICATION

This application claims priority to Japanese Patent Application No. 2003-344516 filed Oct. 2, 2003, which is hereby expressly incorporated by reference herein in its entirety.

BACKGROUND OF THE INVENTION

1. Field of the Invention

The present invention relates to an apparatus for manufacturing semiconductor devices, a method of manufacturing the semiconductor devices, and a semiconductor device manufactured by the apparatus and method.

2. Description of the Prior Art

In general, when manufacturing a semiconductor device, a semiconductor chip is mounted on top of a substrate, and then a process for connecting the semiconductor chip and the substrate is carried out by soldering.

In the prior art, this kind of process is carried out by a method like that disclosed in Japanese Laid-Open Patent Application No. Hei. 11-97839 (see lines 14 to 24 in the left column of page 10), for example. Namely, using a mounter, a semiconductor chip (semiconductor component) is mounted on top of a substrate (that is, a substrate for mounting semiconductor components), and then the substrate having the semiconductor chip mounted thereon is conveyed through the inside of a reflow furnace to melt and solidify solder provided at the terminal portions of the substrate. In this way, the semiconductor chip and the substrate are connected to manufacture a semiconductor device.

However, in this method, after the semiconductor chip is mounted on the top of the substrate, the substrate is conveyed to the reflow furnace. At that time, there are cases where the position of the semiconductor chip is dislocated (displaced) due to vibration and the like.

Further, the substrate normally has a shape in the form of a long plate-shaped frame, and in this case, when connecting the semiconductor chip and the substrate, there are many cases where the substrate and the semiconductor chip are subjected to a very large heat energy compared with the heat energy required to melt the solder. Namely, in the case where the substrate has such a long plate shape, a relatively long time is required for the substrate to pass through the reflow furnace, and this makes the heat energy (heat history) received by the substrate and the semiconductor chip become larger than necessary. As a result, warping and the like can easily occur in the substrate, and there is the possibility that the semiconductor chip will experience adverse effects.

When this kind of dislocation, warping and the like occur, a poor solder connection is easily created between the substrate and the semiconductor chip, and this lowers the yield of semiconductor devices. Further, there is also the problem of lowering reliability of manufactured semiconductor devices.

Further, in recent years, the trend to create high functionality in electronic devices such as portable phones and the like has become increasingly widespread. In accordance with this trend, there is a tendency that seeks for higher functionality demanded in semiconductor devices such as LSI and the like provided in electronic devices, but the effort to provide all functions demanded for these semiconductor devices in a single chip causes various problems such as long development periods and increased development costs for the semiconductor devices. In this regard, in order to solve these problems, semiconductor devices having a module structure in which semiconductor packages such as different types of LSI or the like are laminated and integrated have been used. However, the same problems described above also occur in the manufacturing of semiconductor devices having this kind of module structure.

SUMMARY OF THE INVENTION

It is an object of the present invention to provide a semiconductor device that makes it difficult for poor connections to occur, and further to provide an apparatus for manufacturing semiconductor devices and a method of manufacturing semiconductor devices that enable to prevent the occurrence of poor connections of the semiconductor device to be obtained and also enable to suppress manufacturing costs from being increased.

In order to achieve the above-identified object, the present invention is directed to an apparatus for manufacturing semiconductor devices, in which each semiconductor device includes a substrate for mounting semiconductor components thereon and a plate-shaped semiconductor component which is jointed to the substrate for mounting semiconductor components. The apparatus for manufacturing semiconductor devices includes a plurality of receiving portions for receiving the semiconductor components therein while restricting the movement of each of the semiconductor components in a direction parallel to a top surface of each semiconductor component.

According to the present invention having the above structure, it is possible to provide an apparatus for manufacturing semiconductor devices that enables to prevent the occurrence of poor connections of the semiconductor device to be manufactured and also enables to suppress manufacturing costs from being increased in manufacturing the semiconductor device. In particular, since the weight of the substrate for mounting semiconductor components is loaded on the semiconductor device, it is possible to prevent not only the occurrence of displacement of the semiconductor component but also the occurrence of warping of the semiconductor component caused by heating or the like due to the weight of the loaded substrate for mounting semiconductor components. This makes it possible to provide an apparatus for manufacturing semiconductor devices that can prevent the occurrence of the semiconductor device having poor connection in manufacturing the semiconductor devices and control the manufacturing costs of the semiconductor devices.

In the apparatus for manufacturing semiconductor devices according to the present invention, it is preferred that the receiving portion is a concave portion in which the semiconductor component is adapted to be received.

This makes it possible to carry out the positioning (alignment) of the semiconductor components on the apparatus for manufacturing semiconductor devices easily and reliably, and as a result, it is possible to make the reliability of the obtained semiconductor device especially high.

Further, in the apparatus for manufacturing semiconductor devices according to the present invention, it is also preferred that the receiving portion has a bottom surface, and the receiving portion is communicated with a suction flow path for attracting the semiconductor component toward the side of the bottom surface of the receiving portion.

This makes it possible to prevent the occurrence of warping of the semiconductor component easily and reliably, and as a result, it is possible to make the reliability of the obtained semiconductor device especially high.

Moreover, in the apparatus for manufacturing semiconductor devices according to the present invention, it is also preferred that an adhesive material for immovably holding the semiconductor component to the receiving portion is provided within the receiving portion.

This makes it possible to immovably hold (secure) the semiconductor components more surely without adding any other device, and as a result, it is possible to provide an apparatus for manufacturing semiconductor devices capable of preventing the manufacturing costs of the semiconductor devices more effectively.

Furthermore, it is also preferred that the apparatus for manufacturing semiconductor devices according to the present invention further includes pressing means for pressing the substrate for mounting semiconductor components which is mounted on the semiconductor component.

This makes it possible to more efficiently prevent warping and the like of the substrate for mounting semiconductor components due to the high-temperature atmosphere. As a result, this further improves the reliability of the connection between the semiconductor components and the substrate for mounting semiconductor components in the semiconductor devices.

In another aspect of the present invention, the invention is directed to a method of manufacturing semiconductor devices. The method is characterized by using the apparatus for manufacturing semiconductor devices as described above.

According to the invention described above, it is possible to provide the semiconductor device in which poor connections are difficult to occur and which has high reliability.

A method of manufacturing semiconductor devices according to the invention, in which each semiconductor device including a substrate for mounting semiconductor components thereon and a plate-shaped semiconductor component which is jointed to the substrate for mounting semiconductor components, includes the steps of:

receiving the semiconductor components within a plurality of receiving portions to restrict the movement of each of the semiconductor components in a direction parallel to a top surface of each semiconductor component; and jointing the semiconductor component to the substrate for mounting semiconductor components.

According to the present invention, it is possible to provide a method of manufacturing semiconductor devices that enables to prevent the occurrence of poor connections of the semiconductor device to be manufactured and also enables to suppress the manufacturing costs of the semiconductor devices from being increased in manufacturing the semiconductor device. In particular, since the weight of the substrate for mounting semiconductor components is loaded on the semiconductor device, it is possible to prevent not only the occurrence of displacement of the semiconductor component but also the occurrence of warping of the semiconductor component caused by heating or the like due to the weight of the loaded substrate for mounting semiconductor components. This makes it possible to prevent the occurrence of the semiconductor device having poor connection in manufacturing the semiconductor devices and to control the manufacturing costs of the semiconductor devices.

In still another aspect of the present invention, the invention is directed to a semiconductor device. The semiconductor device according to the present invention is characterized by being manufactured using the apparatus for manufacturing semiconductor devices described above.

This also makes it possible to provide the semiconductor device in which poor connections are difficult to occur and which has high reliability.

Further, a semiconductor device of the present invention is characterized by being manufactured by the method described above.

This also makes it possible to provide the semiconductor device in which poor connections are difficult to occur and which has high reliability.

BRIEF DESCRIPTION OF THE DRAWINGS

The above and other objects, features, and the advantages of the invention will readily become more apparent from the following detailed description of preferred embodiments of the invention with reference to the accompanying drawings.

FIG. 1 is a drawing which shows one example of a structure of an apparatus for manufacturing semiconductor devices according to a first embodiment of the present invention, wherein

FIG. 2 is a drawing which shows one example of a structure of a substrate for mounting semiconductor components, wherein

FIG. 3 is a drawing which shows one example of a structure of the semiconductor component, wherein

FIG. 6 is a drawing which shows one example of a structure of an apparatus for manufacturing semiconductor devices according to a second embodiment of the present invention, wherein

FIG. 8 is a drawing which shows one example of a structure of an apparatus for manufacturing semiconductor devices according to a third embodiment of the present invention, wherein

FIG. 9 is a drawing which shows one example of a structure of an apparatus for manufacturing semiconductor devices according to a fourth embodiment of the present invention, wherein

DETAILED DESCRIPTION OF THE PREFERRED EMBODIMENTS

A description of the preferred embodiments of a semiconductor device, an apparatus for manufacturing semiconductor devices and a method of manufacturing semiconductor devices according to the present invention will be given below.

First, a semiconductor device and an apparatus for manufacturing semiconductor devices according to a first embodiment of the present invention will be described.

Figure 1A:
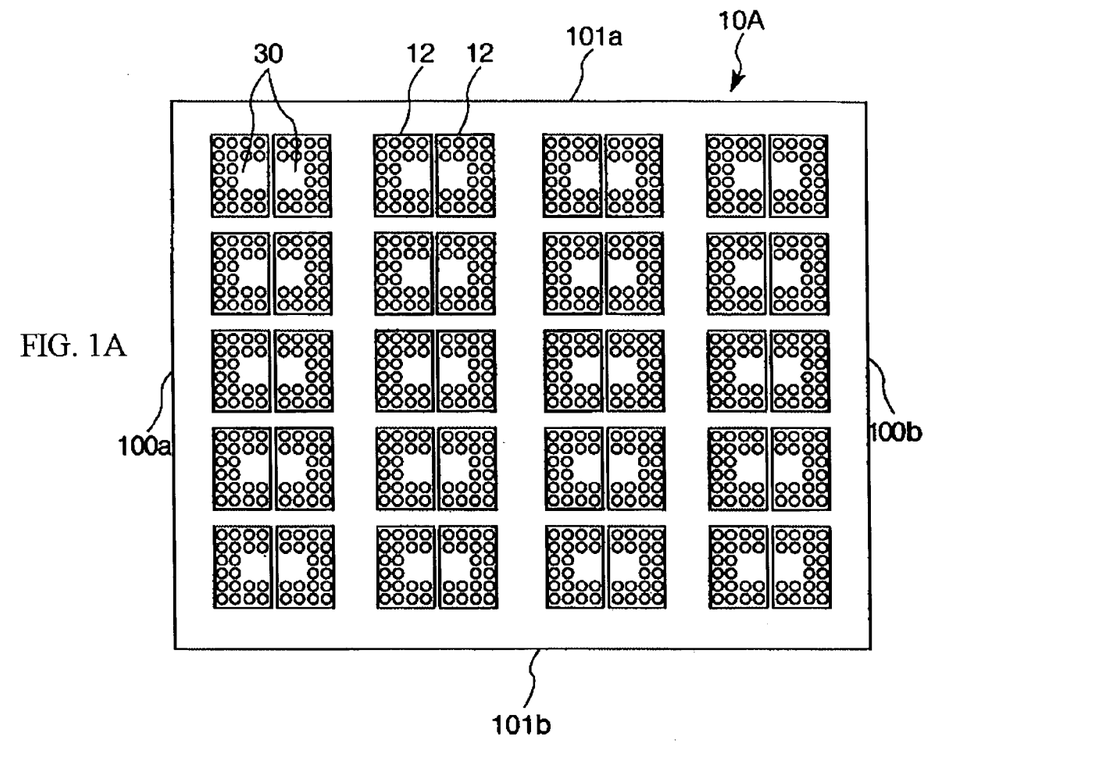
FIG. 1A is a plan view of the apparatus for manufacturing semiconductor devices.
Figure 1B:
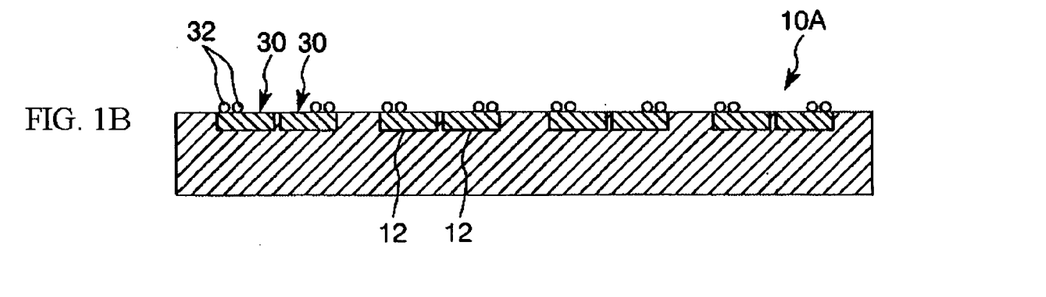
FIG. 1B is a cross-sectional view of the apparatus for manufacturing semiconductor devices.
Figure 2A:
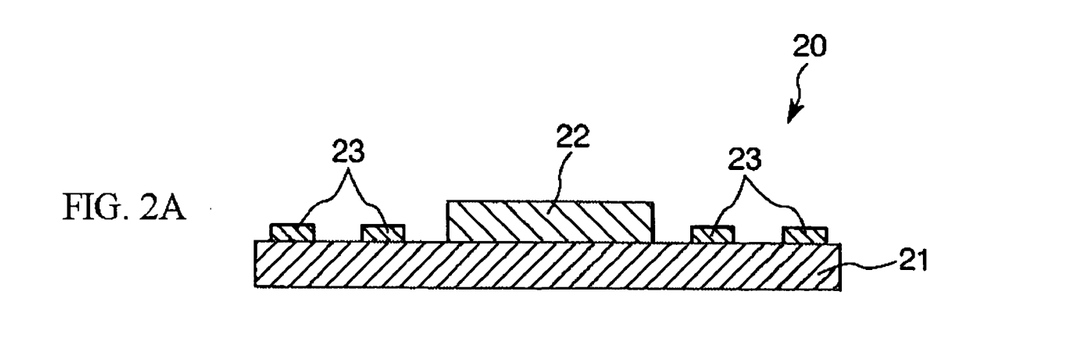
FIG. 2A is a cross-sectional view of the substrate for mounting semiconductor components.
Figure 2B:
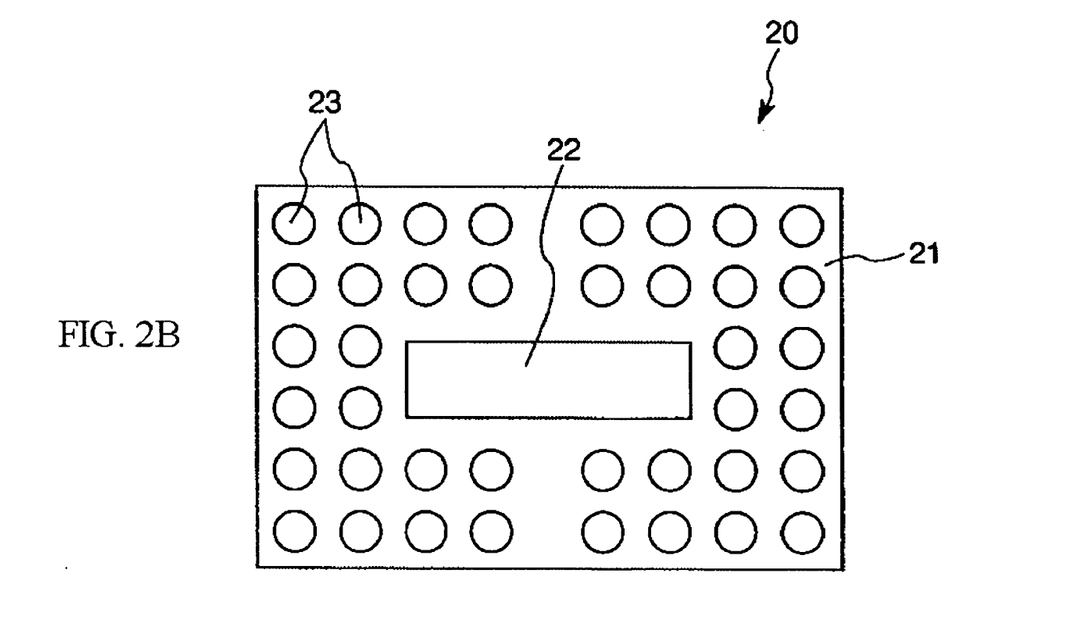
FIG. 2B is a plan view of the substrate for mounting semiconductor components.
Figure 3A:
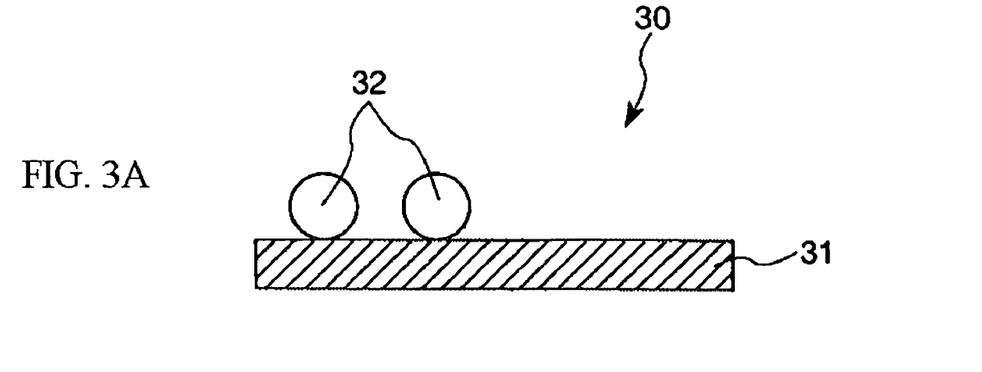
FIG. 3A is a cross-sectional view of the semiconductor component.
Figure 3B:
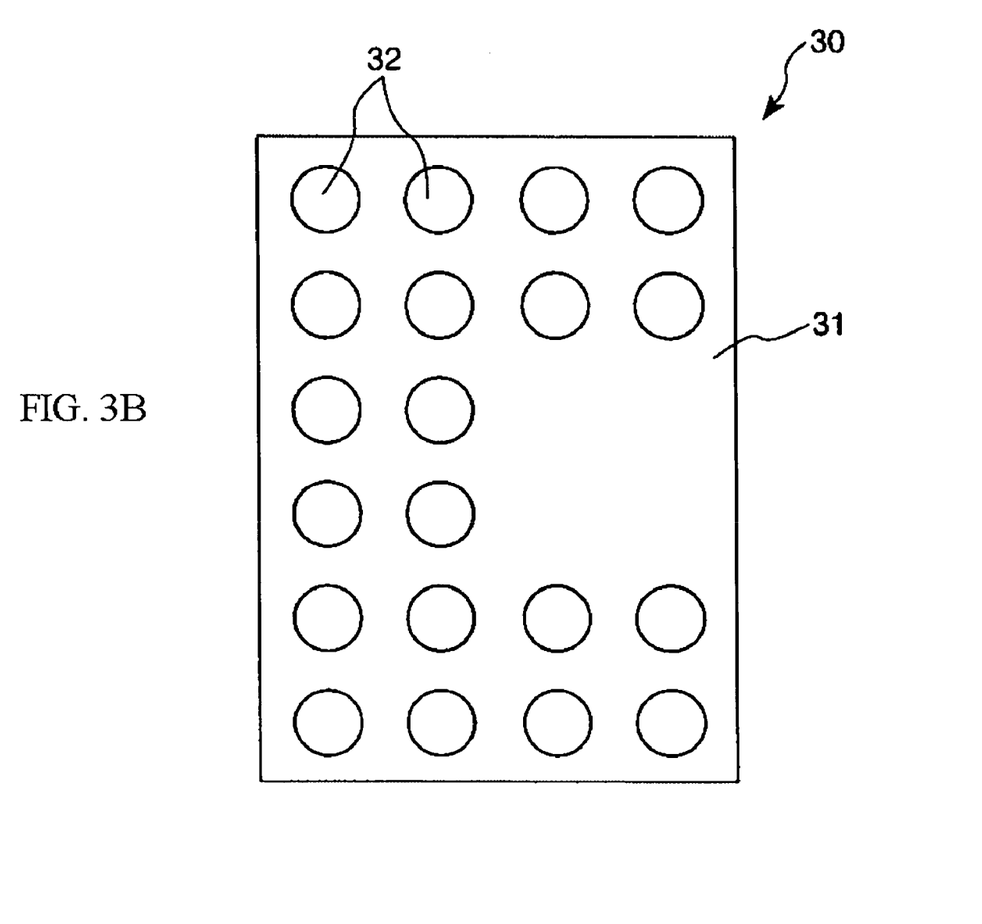
FIG. 3B is a plan view of the semiconductor component.
Figure 4:
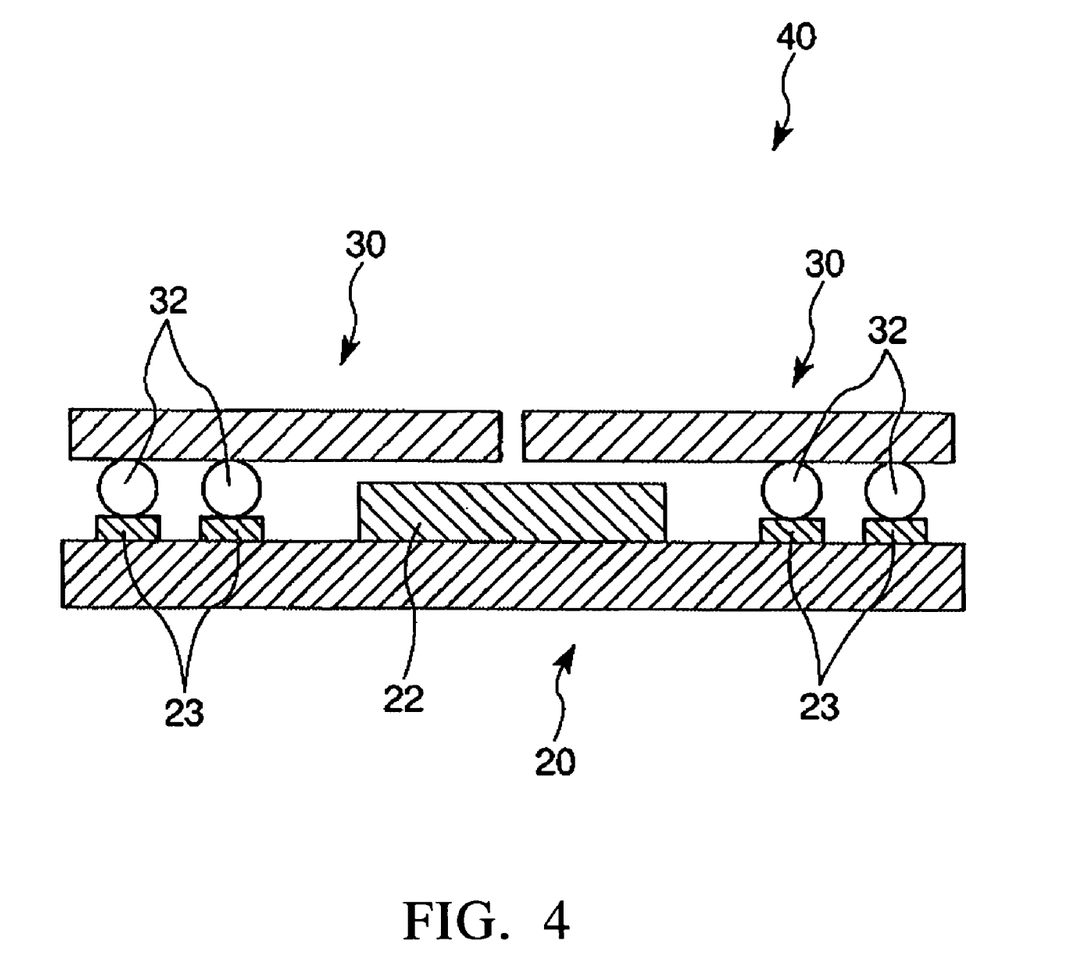
FIG. 4 is a cross-sectional view which shows one example of a structure of a semiconductor device of the present invention.

FIG. 1 is a drawing which shows one example of a structure of an apparatus for manufacturing semiconductor devices according to a first embodiment of the present invention, wherein FIG. 1A is a plan view of the apparatus for manufacturing semiconductor devices, and FIG. 1B is a cross-sectional view of the apparatus for manufacturing semiconductor devices. FIG. 2 is a drawing which shows one example of a structure of a substrate for mounting semiconductor components (lower semiconductor package), wherein FIG. 2A is a cross-sectional view of the substrate for mounting semiconductor components, and FIG. 2B is a plan view of the substrate for mounting semiconductor components. FIG. 3 is a drawing which shows one example of a structure of the semiconductor component (upper semiconductor package), wherein FIG. 3A is a cross-sectional view of the semiconductor component, and FIG. 3B is a plan view of the semiconductor component. FIG. 4 is a cross-sectional view which shows one example of a structure of a semiconductor device of the present invention.

Before describing the semiconductor device, a description will be given for the lower semiconductor package (substrate for mounting semiconductor components) and the upper semiconductor package (semiconductor components) used in the present embodiment.

A lower semiconductor package (substrate for mounting semiconductor components) 20 includes a plate-shaped substrate 21, a driver IC 22 which is mounted using an ACF (Anisotropic Conductive Film), and a plurality of lands 23 which are used as terminals (see FIG. 2).

The substrate 21 is constructed from a semiconductor material such as Si or the like, or a resin material such as aramid resin or the like, for example. The thickness (average thickness) of the substrate 21 has no particular limitation, but it is normally in the range of 0.05 to 1 mm. Further, the substrate 21 is not limited to one being constructed by a single layer, and it may be constructed as a laminated body having a plurality of layers.

The lands 23 are provided on a connection surface (joint surface) to the upper semiconductor package 30 in a pattern corresponding to the arrangement of solder balls 32 on the upper semiconductor package (semiconductor component) 30 described later.

The lands 23 may be formed by various plating methods or the like such as an electroless plating method, an electrolytic plating method or the like, but it is preferred that the lands 23 are formed by an electroless plating method, in particular. By forming the lands 23 using an electroless plating method, it is possible to configure (design) an arrangement in which the spacing (pitch) between adjacent lands 23 is made smaller (about 5 to 30 μm, for example). This arrangement is ideally suited to making a narrow pitch (making a high precision arrangement for the terminals) required to give a semiconductor device 40 and an electronic device (a portable phone (cell phone) or the like, for example) equipped with the semiconductor device 40 high performance and compactness.

Examples of the constituent material of the lands 23 include Ni, Au, Cu, Sn, Ag and alloys containing one or more kinds selected from these metals. Among these materials, Ni, Au, Cu, Sn or an alloy containing one or more kinds selected from these metals is particularly preferred. These materials have excellent electrical conductivity, and excellent adhesion with the constituent materials of the driver IC 22 and the solder balls 32 described later.

Each of the lands 23 has substantially the same thickness (height), and this thickness (average thickness) is not limited to any particular value, but it is preferably within the range of about 5 to 30 μm, for example. Further, the cross-sectional area of each of the lands 23 is not limited to any particular value, but it is preferably within the range of about $5 \times 10^{-3}$ to $5 \times 10^{-2}$ mm$^2$.

These lands 23 can be formed on the connection surface of the substrate 21 by a photolithography method, for example, in which a desired resist pattern is formed, and then using this resist pattern as a mask, an electroless plating method is carried out to form the lands 23.

Further, the upper semiconductor package (semiconductor component) 30 has an substantially rectangular plate shape, and includes an upper semiconductor package body 31 in which three layers of memory are laminated, and a plurality of solder balls 32 arranged on the connection surface to the lower semiconductor package 20 so as to correspond with each land 23 of the lower semiconductor package 20 (see FIG. 3).

The constituent material of the solder balls 32 is not limited to any particular material, but it is preferable that a solder material is used as the main component. The solder material should melt at a relatively low temperature and have excellent electrical conductivity, and should be easy to obtain. Examples of such a solder material include a Pb-containing solder such as Pb—Sn type solder and the like, a lead-free solder (solder that does not contain Pb) such as Sn—Ag—Cu type solder, Sn—Zn type solder, Sn—Cu type solder, Sn—Bi type solder and the like, silver solder, copper solder, copper phosphate solder, brass solder, aluminum solder, nickel solder and the like, and one of these or a combination of two or more of these. Among these materials, Pb-containing solder, or lead-free solder (solder that does not contain Pb) is preferably used. In particular, lead-free solder (solder that does not contain Pb) is especially beneficial in view of both connection strength and effects on the environment.

The method of forming the solder balls 32 is not limited to any particular method, and may be a wet plating method such as a dipping method, a printing method, electrolytic plating, immersion plating, electroless plating and the like, a chemical vapor deposition (CVD) method such as heat CVD, plasma CVD, laser CVD and the like, a dry plating method such as vacuum deposition, spattering, ion plating and the like, flame spray coating and the like. Among these methods, the dipping method or the printing method is particularly preferred. According to any one of these methods, it is possible to form the solder balls 32 easily and reliably.

In the case where the dipping method is used, the solder balls 32 can be formed by immersing the ends of terminals (not shown in the drawings) of the upper semiconductor package 30 into the constituent material of the solder balls 32 in a molten state, for example.

On the other hand, in the case where the printing method is used, the solder balls 32 can be formed by applying a mask having through holes to the upper semiconductor package 30, and then brushing on the constituent material of the solder balls 32 in a molten state with a squeegee to supply the constituent material to the upper surface (the face of the side to which the lower semiconductor package 20 is jointed) of the upper semiconductor package 30 via the through holes, for example. In this regard, the resist pattern used at the time the lands 23 are formed by the electroless plating method can be used with this mask.

As shown in FIG. 4, the semiconductor device 40 is formed by integrating one lower semiconductor package 20 and two upper semiconductor packages 30 by connection between the plurality of lands 23 and the plurality of solder balls 32 formed at positions corresponding to the lands 23. This kind of semiconductor device 40 is manufactured using an apparatus for manufacturing semiconductor devices and a method of manufacturing semiconductor devices described later.

Next, an apparatus for manufacturing semiconductor devices in a first embodiment will be described below. In the description given below, the upper side in FIG. 1B is referred to as "upper", and the lower side in FIG. 1B is referred to as "lower".

The apparatus 10A for manufacturing semiconductor devices shown in FIG. 1B has a plate-shaped structure made of a metal having high thermal conductivity, and is provided with a plurality of receiving portions (concave portions) 12 for receiving the upper semiconductor packages 30 on its upper surface. Further, the apparatus 10A for manufacturing semiconductor devices has two first sides 100a, 100b each extending in a first direction, and two second sides 101a, 101b each extending in a second direction substantially perpendicular to the first sides 100a, 100b.

The receiving portion (concave portion) 12 has a function of restricting the movement of the upper semiconductor package 30 in a direction parallel to a top surface of each of the upper semiconductor packages 30 (in a surface direction of the apparatus 10A for manufacturing semiconductor devices) in addition to a function of receiving the upper semiconductor package (semiconductor component) 30.

Each receiving portion (concave portion) 12 receives a bottom portion of the upper semiconductor package body 31 with an opening thereof so that the connection surface of the upper semiconductor package 30 faces upward (that is, so that the connection surface of the upper semiconductor package 30 faces the side of the lower semiconductor package 20 when mounting on the lower semiconductor package 20. However, it is preferable that the size of the opening of the receiving portion 12 such as longitudinal and lateral lengths of the opening is formed so as to ensure a narrow gap between the longitudinal and lateral lengths of the opening and the longitudinal and lateral lengths of the upper semiconductor package body 31. This makes it possible to loosely fit the upper semiconductor package 30, and as a result, it is possible to ensure facility of placing work for the upper semiconductor package 30 in which the upper semiconductor packages 30 are placed onto the apparatus 10A for manufacturing semiconductor devices with a mounter or by hand.

As mentioned above, it is preferable that the longitudinal and lateral lengths of the opening of the receiving portion 12 are set so as to ensure a narrow gap between the longitudinal and lateral lengths of the opening and the longitudinal and lateral lengths of the upper semiconductor package body 31. It is also preferable that the narrow gap is normally in the range of 0.05 to O. 1 mm. This makes it possible to carry out the placing work of the upper semiconductor package 30 to the apparatus 10A for manufacturing semiconductor devices easily, and the receiving portion 12 can restrict the relative movement of the received upper semiconductor package 30 with respect to the apparatus 10A for manufacturing semiconductor devices surely.

Further, it is preferable that the depth of the receiving portion 12 is set to a predetermined depth at which the solder balls 32 on the received upper semiconductor package 30 can protrude from the upper surface of the apparatus 10A for manufacturing semiconductor devices surely.

The receiving portions 12 are unevenly arranged on the upper surface of the apparatus 10A for manufacturing semiconductor devices in consideration with the manufacturing efficiency of the semiconductor devices 40. For example, in the case where the lower semiconductor package 20 has a substantially rectangular frame shape, a large number of upper semiconductor packages 30 are placed on the connection surfaces of the lower semiconductor packages 20, and a plurality of semiconductor devices 40 are obtained by dicing from the lower semiconductor packages 20 on which the plurality of upper semiconductor packages 30 are placed, then the positional relationship between adjacent receiving portions 12 on the upper surface of the apparatus 10A for manufacturing semiconductor devices (that is, the positional relationship between the receiving portions 12 on which the upper semiconductor packages 30 constituting separate semiconductor devices 40 by dicing are received) is set so as to correspond to the positional relationship of the plurality of upper semiconductor packages 30 on the connection surface of the lower semiconductor packages 20 with respect to the first direction in which the first sides 100a, 100b extend, and is set to the positional relationship in which the adjacent lower semiconductor packages 20 on the connection surface do not interfere with each other with respect to the second direction in which the second sides 101a, 101b extend.

The receiving portions 12 are formed by applying a counterboring process to the upper surface of the apparatus 10A for manufacturing semiconductor devices. A suitable counterboring process is selected from various processing such as a discharging process, a cutting process, a welding process, a pressing process and the like to carry out the counterboring process.

Further, it is preferable that material constituting the apparatus 10A for manufacturing semiconductor devices is selected from a metal having good thermal conductivity or a material that radiates heat (aluminum, titanium, copper alloy, stainless steel or the like, for example). In this way, because the thermal conductivity is improved, it is possible to carry out soldering (create a solder connection, for example) between the upper semiconductor package 30 and the lower semiconductor package 20, which are placed on the upper surface of the apparatus 10A for manufacturing semiconductor devices reliably within a short time during a reflow process described later.

Next, a method of manufacturing semiconductor devices 40 from the lower semiconductor packages 20 and the upper semiconductor packages 30 using the apparatus 10A for manufacturing semiconductor devices will be described with reference to the drawings.

FIG. 5 is a drawing which shows one example of a method of manufacturing semiconductor devices using the apparatus for manufacturing semiconductor devices shown in FIG. 1. In the description given below, the upper side in FIG. 5 is referred to as "upper", and the lower side in FIG. 5 is referred to as "lower".

Figure 5A:
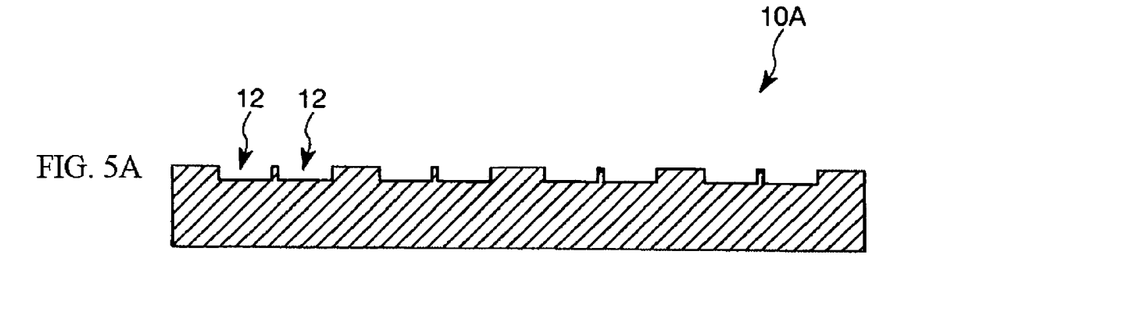
FIG. 5 is a drawing which shows one example of a method of manufacturing semiconductor devices using the apparatus for manufacturing semiconductor devices shown in FIG. 1.

First, the apparatus 10A for manufacturing semiconductor devices is arranged so that the surface on which the receiving portions 12 are arranged faces upward in the drawings (see FIG. 5A).

Figure 5B:
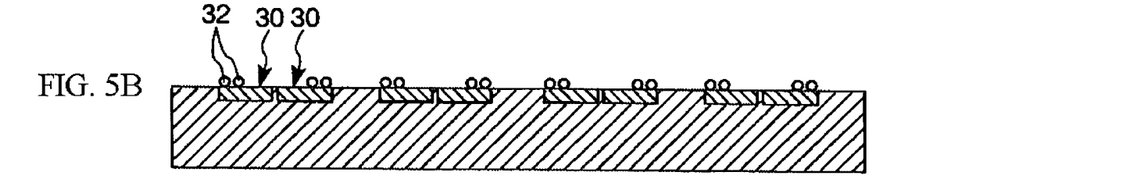
Figure 5C:
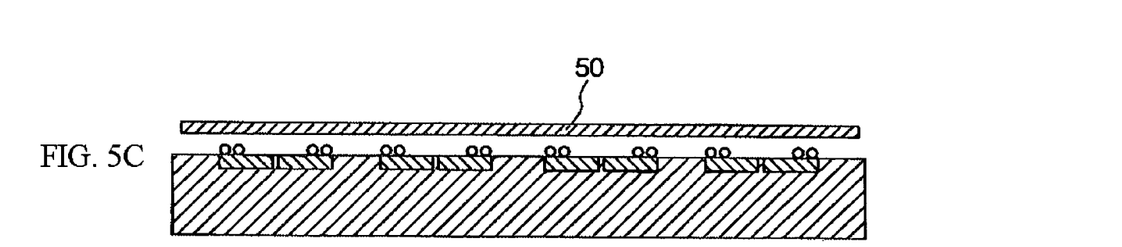
Figure 5D:
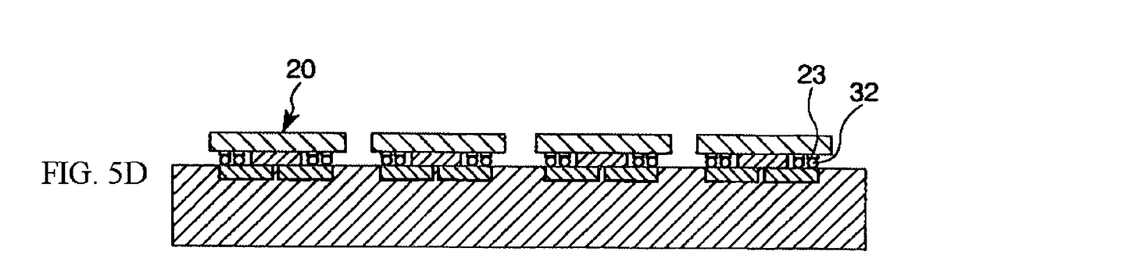

Subsequently, the upper semiconductor packages 30 are received (housed) in the plurality of receiving portions 12 on the apparatus 10A for manufacturing semiconductor devices in a predetermined direction (see FIG. 5B).

At this time, it is preferable that a gap between each side in the opening of the receiving portion 12 and each side of the upper semiconductor package body 31 corresponding to each of the sides in the opening is normally in the range of 0.3 to 0.75 mm. This makes it possible to carry out the placing work of the upper semiconductor packages 30 to the apparatus 10A for manufacturing semiconductor devices easily, and at following steps the receiving portions 12 can restrict the relative movement of the received upper semiconductor packages 30 with respect to the apparatus 10A for manufacturing semiconductor devices reliably.

Then, a flux 50 is applied to the upper surface of the apparatus 10A for manufacturing semiconductor devices on which the plurality of upper semiconductor packages 30 are placed with a transcription apparatus. The applied flux 50 may be either a rosin type flux or a water-soluble flux. Examples of a rosin type flux include rosin base flux, mildly activated rosin base flux, activated rosin base flux and the like, and even though any of these fluxes may be used, mildly activated rosin base flux is preferred in view of solderability (connectivity) in particular (see FIG. 5C).

On the upper surface of the apparatus 10A for manufacturing semiconductor devices on which the flux 50 is applied, each of the plurality of lower semiconductor packages 20 is mounted on the two upper semiconductor packages 30 so that the plurality of lands 23 of each lower semiconductor package 20 are contacted with the plurality of solder balls 32 corresponding to them. At this time, the mounter identifies recognition mark (not shown in the drawings) or a pad set (marked) on the connection surface of each of the upper semiconductor packages 30, whereby the lower semiconductor package 20 corresponding to the two upper semiconductor packages 30 is mounted thereon (see FIG. 5D).

Subsequently, the apparatus 10A for manufacturing semiconductor devices is conveyed to the inside of a reflow furnace at a state where the lower semiconductor package 20 is mounted on the upper semiconductor packages 30 in this way. At this time, the relative movement of the upper semiconductor package 30 with respect to the apparatus 10A for manufacturing semiconductor devices can be restricted. Further, the weight of relative heavy upper semiconductor packages 30 is loaded onto the lower semiconductor package 20. Therefore, it is possible to prevent the occurrence of displacement of the upper semiconductor package 30 effectively. As a result, it is possible to prevent the occurrence of poor soldering connections between the lower semiconductor package 20 and the upper semiconductor package 30, and to improve the reliability of the obtained semiconductor device 40, and suppress the manufacturing costs of the semiconductor devices 40.

Then, the upper semiconductor packages 30 and the lower semiconductor packages 20 conveyed to the inside of the reflow furnace are jointed to each other by the reflow process. The conditions for the reflow process are not limited to any particular values, but it is preferable that the atmospheric temperature is within the range of about 150 to 300° C., and more preferably it is within the range of about 200 to 260° C., for example. Further, it is preferable that the reflow time is within the range of about 1 to 30 minutes, and more preferably it is within the range of about 3 to 10 minutes, for example. Moreover, this reflow process may be carried out while supplying high frequency waves, ultrasound waves or the like as needed, for example.

At this time, because the weight of relative heavy upper semiconductor packages 30 is loaded onto the lower semiconductor package 20 described above, it is possible to prevent the occurrence of warping of the upper semiconductor package body 31 caused by a high-temperature atmosphere inside the reflow furnace. As a result, it is possible to mount the lower semiconductor package 20 to the upper semiconductor packages 30 with high accuracy, and it is possible to more effectively prevent the occurrence of poor soldering connections between the lower semiconductor package 20 and the upper semiconductor packages 30.

Then, the apparatus 10A for manufacturing semiconductor devices is removed from the reflow furnace, and the lower semiconductor packages 20 to which the upper semiconductor packages 30 are connected by reflowing, that is, the semiconductor devices 40 are further removed from the apparatus 10A for manufacturing semiconductor devices.

The semiconductor device 40 obtained by the above mentioned way can be suitably used in (or applied to) portable phones (cell phones), inkjet type ejection apparatuses (ink jet printers, for example), laptop type personal computers, televisions, video cameras, video tape recorders, car navigation devices, pagers, electronic notebooks (including those having communication functions), electronic dictionaries, pocket calculators, electronic game devices, word processors, work stations, television telephones, television monitors for crime prevention, electronic binoculars, POS terminals, medical devices (electronic thermometers, blood pressure meters, blood sugar meters, electrocardiogram measuring devices, ultrasound diagnostic devices, electronic endoscopes, for example), fish finders, various measurement devices, gauges (gauges for vehicles, airplanes, ships and the like, for example), flight simulators and the like.

Next, an apparatus for manufacturing semiconductor devices and a method of manufacturing semiconductor devices using the apparatus for manufacturing semiconductor devices according to a second embodiment of the present invention will be described. The following description will focus on the points of difference between the first embodiment described above and the second embodiment, and therefore a description of the same elements is omitted.

Figure 6A:
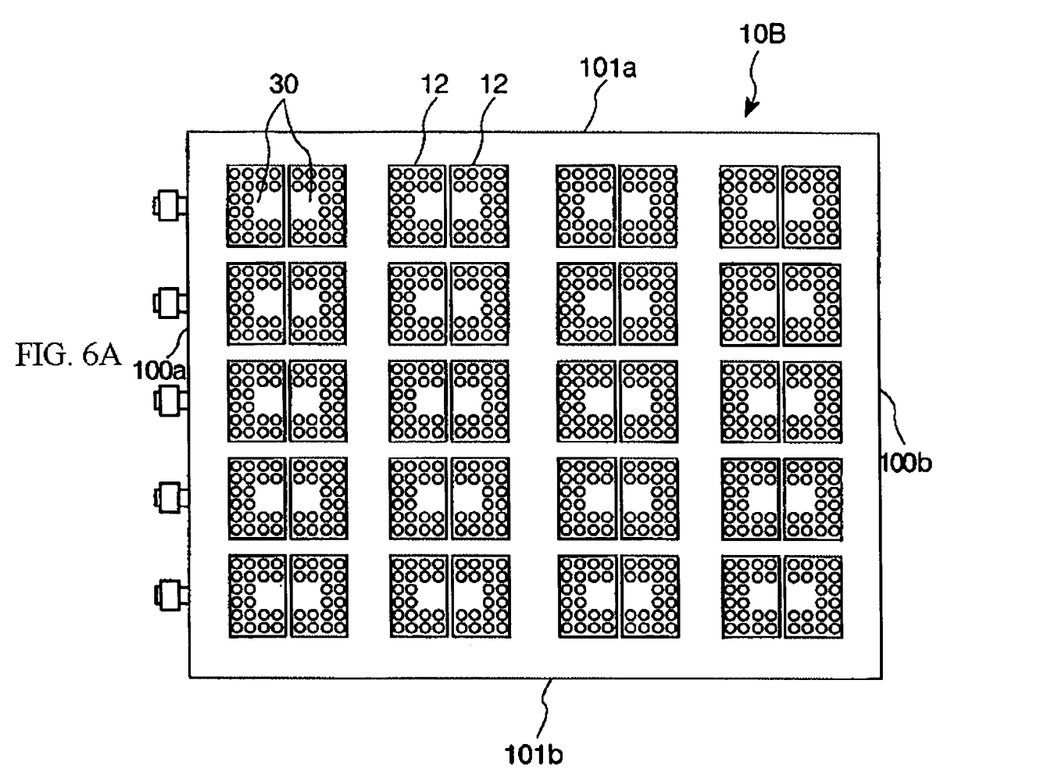
FIG. 6A is a plan view of the apparatus for manufacturing semiconductor devices.
Figure 6B:
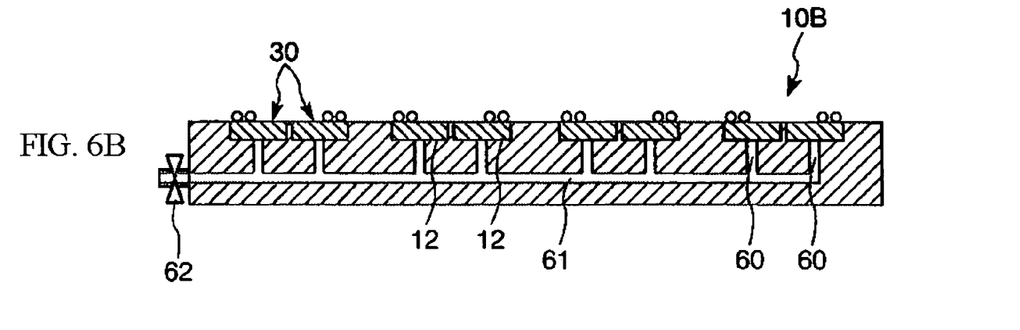
FIG. 6B is a cross-sectional view of the apparatus for manufacturing semiconductor devices.

FIG. 6 is a drawing which shows one example of a structure of an apparatus for manufacturing semiconductor devices according to a second embodiment of the present invention, wherein FIG. 6A is a plan view of the apparatus for manufacturing semiconductor devices, and FIG. 6B is a cross-sectional view of the apparatus for manufacturing semiconductor devices. In the description given below, the upper side in FIG. 6B is referred to as "upper", and the lower side in FIG. 6B is referred to as "lower".

First, the structure of an apparatus 10B for manufacturing semiconductor devices of the second embodiment will be described.

The apparatus 10B for manufacturing semiconductor devices shown in FIG. 6 further has a plurality of decompression holes (part of suction flow path) 60 that open at the bottom portions of the respective receiving portions 12 in comparison with the apparatus 10A for manufacturing semiconductor devices shown in FIG. 1. In the apparatus 10B for manufacturing semiconductor devices, each of the decompression holes 60 is communicated with a communicating tube (part of the suction flow path) 61 arranged parallel to an upper surface of the apparatus 10B for manufacturing semiconductor devices, and the communicating tube 61 is connected to a decompression pump such as a rotary pump or the like (not shown in the drawings) via a valve 62 provided at one side surface corresponding to a first side 100a of the apparatus 10B for manufacturing semiconductor devices. By operating the decompression pump to reduce the pressure of the lower surface sides of the upper semiconductor package bodies 31 received in the receiving portions 12, each of the upper semiconductor packages 30 is attracted (drawn) to each of the decompression holes 60. This makes it possible to prevent the occurrence of warping or the like of the upper semiconductor package 30 easily and reliably, and as a result, it is possible to make the reliability of the obtained semiconductor device 40 especially high.

In this regard, the shape of the receiving portion 12 in the apparatus 10B for manufacturing semiconductor devices shown in FIG. 6, the number of receiving portions 12 in the apparatus 10B for manufacturing semiconductor devices, the positions at which the receiving portions 12 are arranged, and the like are the same as in the apparatus 10A for manufacturing semiconductor devices shown in FIG. 1. Thus, the receiving portions 12 in the apparatus 10B for manufacturing semiconductor devices can restrict the relative movement of the received upper semiconductor packages 30 with respect to the apparatus 10B for manufacturing semiconductor devices effectively.

Next, a method of manufacturing semiconductor devices 40 from the lower semiconductor packages 20 and the upper semiconductor packages 30 using the apparatus 10B for manufacturing semiconductor devices will be described with reference to the drawings.

FIGS. 7A to 7D are drawings which show one example of a method of manufacturing semiconductor devices using the apparatus for manufacturing semiconductor devices shown in FIG. 6. In the description given below, the upper side in FIG. 7 is referred to as "upper", and the lower side in FIG. 7 is referred to as "lower".

Figure 7A:
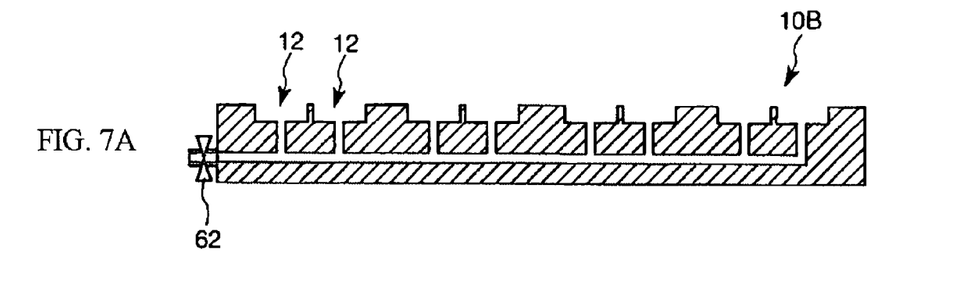
FIG. 7 is a drawing which shows a method of manufacturing semiconductor devices using the apparatus for manufacturing semiconductor devices shown in FIG. 6.

First, the apparatus 10B for manufacturing semiconductor devices is arranged so that the surface on which the receiving portions 12 are arranged faces upward in the drawings (see FIG. 7A).

Figure 7B:
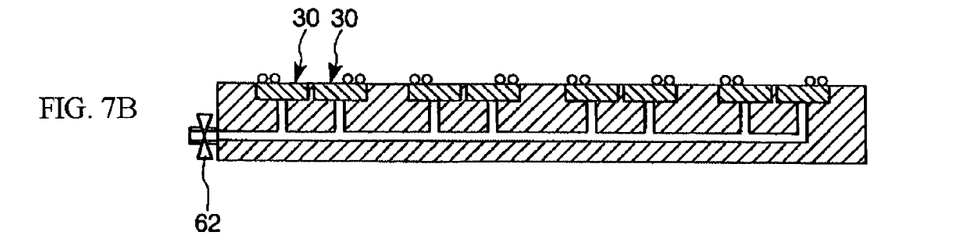

Subsequently, the upper semiconductor packages 30 are received (housed) in the plurality of receiving portions 12 on the apparatus 10B for manufacturing semiconductor devices in a predetermined direction (see FIG. 7B).

In the second embodiment, at following steps the receiving portions 12 can restrict the relative movement of the received upper semiconductor packages 30 with respect to the apparatus 10B for manufacturing semiconductor devices reliably.

Subsequently, a flux 50 is applied to the upper surface of the apparatus 10B for manufacturing semiconductor devices on which the plurality of upper semiconductor packages 30 are placed as well as in the first embodiment (see FIG. 7C).

Figure 7C:
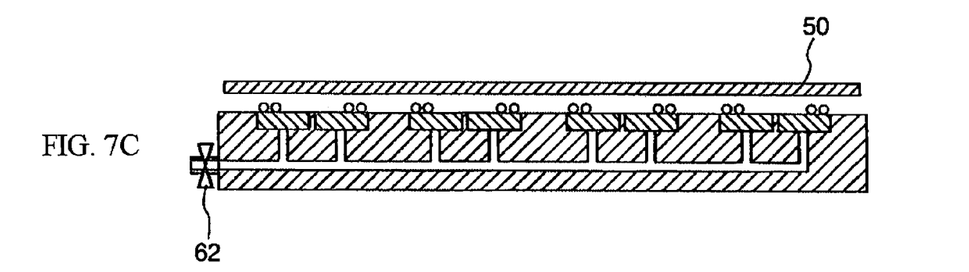
Figure 7D:
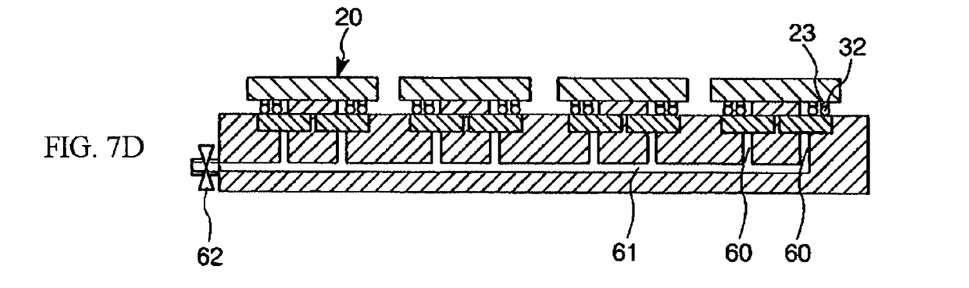

In this regard, the valve 62 is opened at the states from FIG. 7A to FIG. 7C described above.

On the upper surface of the apparatus 10B for manufacturing semiconductor devices on which the flux 50 is applied, each of the plurality of lower semiconductor packages 20 is then mounted on the two corresponding upper semiconductor packages 30 so that the plurality of lands 23 of each lower semiconductor package 20 are contacted with the plurality of solder balls 32 corresponding to them. At this time, a method in which a mounter mounts the corresponding lower semiconductor package 20 on the two upper semiconductor packages 30 is the same as in the first embodiment.

Subsequently, by operating the decompression pump to reduce the pressure of the lower surface sides of the upper semiconductor package bodies 31 received in the receiving portions 12, each of the upper semiconductor packages 30 is attracted (drawn) to the bottom surface of each of the receiving portions 12. When an inner pressure of the decompression holes 60 and the communicating tube 61 is reduced to a predetermined pressure value by the operation of the decompression pump for a predetermined time, the valve 62 is closed to keep the decompressed state of the decompression holes 60 and the communicating tube 61 (see FIG. 7D).

Subsequently, the apparatus 10B for manufacturing semiconductor devices is conveyed to the reflow furnace while the valve 62 is in a close state. At this time, because not only the weight of the upper semiconductor packages 30 is loaded onto the lower semiconductor package 20, but also each of the lower semiconductor packages 20 is attracted to the side of the bottom surface of the corresponding receiving portion 12 via the decompression hole 60, it is possible to restrict the relative movement of the upper semiconductor package 30 with respect to the apparatus 10B for manufacturing semiconductor devices more effectively. This makes it possible to prevent the occurrence of displacement of the upper semiconductor package 30 more reliably. As a result, it is possible to effectively prevent the occurrence of poor soldering connections between the lower semiconductor packages 20 and the upper semiconductor packages 30, and to further improve the reliability of the obtained semiconductor device 40, and to suppress the manufacturing costs of the semiconductor devices 40.

Then, the upper semiconductor packages 30 and the lower semiconductor packages 20 conveyed to the inside of the reflow furnace are jointed to each other by the reflow process. The conditions for the reflow process are the same as in the first embodiment.

At this time, because the upper semiconductor packages 30 are attracted toward the bottom surface side of the receiving portions 12 described above, it is possible to more effectively prevent the occurrence of warping or the like of the upper semiconductor package body 31 caused by a high-temperature atmosphere inside the reflow furnace. As a result, it is possible to mount the lower semiconductor package 20 to the upper semiconductor packages 30 with higher accuracy, and it is possible to further prevent the occurrence of poor soldering connections between the lower semiconductor package 20 and the upper semiconductor packages 30 more effectively. Further, in the apparatus 10B for manufacturing semiconductor devices, because it is possible to attract (draw) the upper semiconductor packages 30 by the decompression pressure, the attracting effect is uninfluenced by temperature or the like at the reflow process. This makes it possible to obtain the semiconductor devices 40 each having a stable quality even though the conditions for the reflow process are changed.

Then, the apparatus 10B for manufacturing semiconductor devices is removed from the reflow furnace, and the semiconductor devices 40 are further removed from the apparatus 10B for manufacturing semiconductor devices.

In this regard, the number of decompression holes 60 each opening in the receiving portion 12, the number of communicating tubes 61, and the like are not limited to ones shown in the drawings, and they may be set to appropriate values according to the size of the upper semiconductor package 30, the number of receiving portions 12, and the like.

Next, an apparatus for manufacturing semiconductor devices according to a third embodiment of the present invention will be described. The following description will focus on the points of difference between the first and second embodiments described above and the third embodiment, and therefore a description of the same elements is omitted.

Figure 8A:
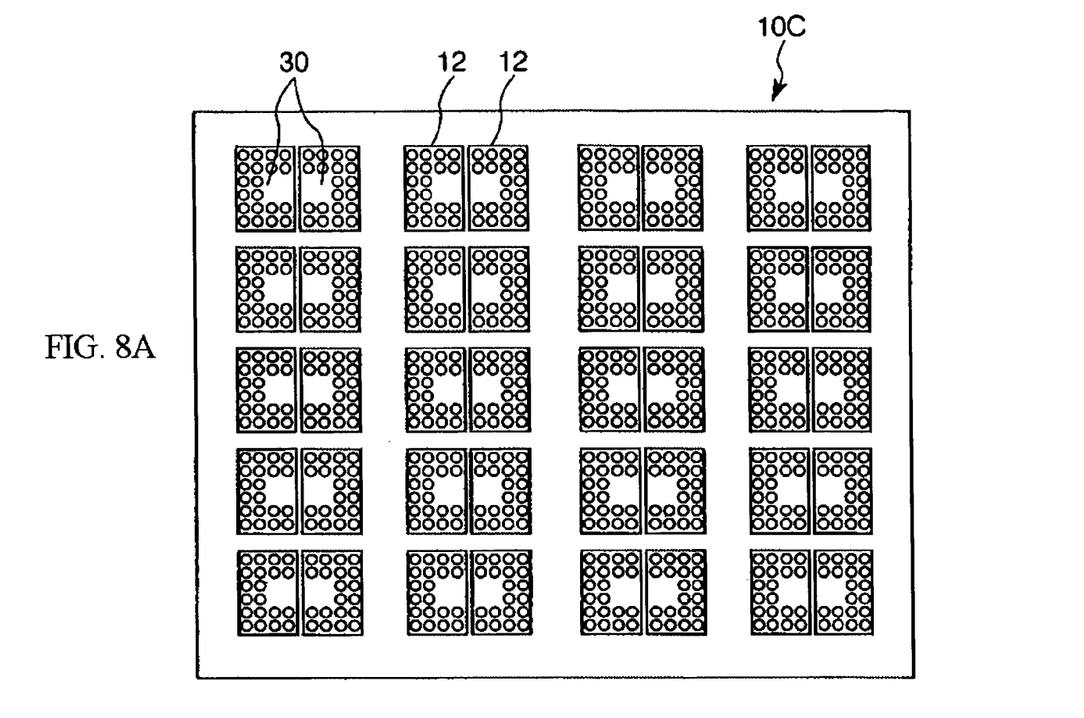
FIG. 8A is a plan view of the apparatus for manufacturing semiconductor devices.
Figure 8B:
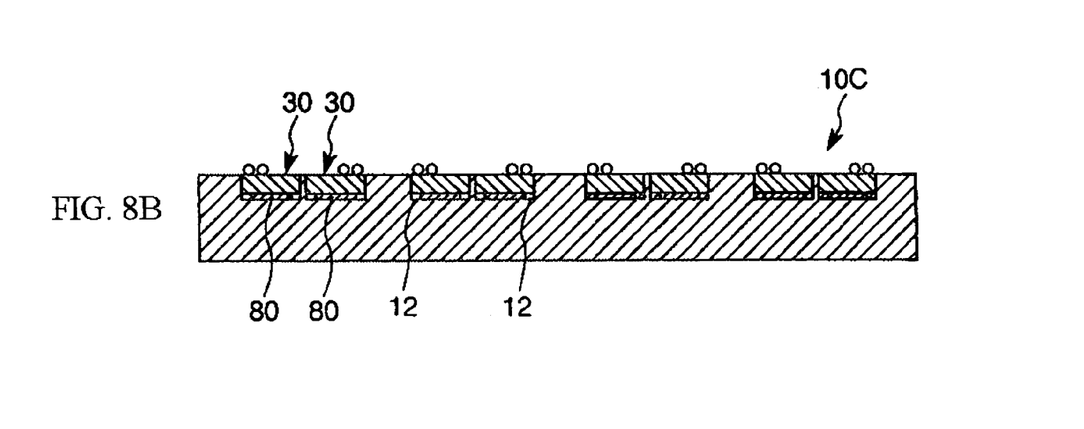
FIG. 8B is a cross-sectional view of the apparatus for manufacturing semiconductor devices.

FIG. 8 is a drawing which shows one example of a structure of an apparatus for manufacturing semiconductor devices according to a third embodiment of the present invention, wherein FIG. 8A is a plan view of the apparatus for manufacturing semiconductor devices, and FIG. 8B is a cross-sectional view of the apparatus for manufacturing semiconductor devices. In the description given below, the upper side in FIG. 8B is referred to as "upper", and the lower side in FIG. 8B is referred to as "lower".

An apparatus 10C for manufacturing semiconductor devices shown in FIG. 8 further has a plurality of heatproof adhesive sheets (adhesive material) 80 provided on the bottom portions of the respective receiving portions 12 in comparison with the apparatus 10A for manufacturing semiconductor devices shown in FIG. 1. By providing such heatproof adhesive sheets, it is possible to immovably hold the upper semiconductor packages 30 in the respective receiving portions 12 of the apparatus 10C for manufacturing semiconductor devices. This makes it possible to prevent the occurrence of warping or the like of the upper semiconductor package 30 easily and reliably, and as a result, it is possible to make the reliability of the obtained semiconductor device 40 especially high. In addition, it is possible to immovably hold the upper semiconductor packages 30 without any other device, and this makes it possible to prevent the manufacturing costs of the semiconductor devices 40 more effectively.

In this regard, the shape of the receiving portion 12 in the apparatus 10C for manufacturing semiconductor devices shown in FIG. 8, the number of receiving portions 12 in the apparatus 10C for manufacturing semiconductor devices, the positions at which the receiving portions 12 are arranged, and the like are the same as in the apparatus 10A for manufacturing semiconductor devices shown in FIG. 1. Thus, the receiving portions 12 in the apparatus 10C for manufacturing semiconductor devices can restrict the relative movement of the received upper semiconductor packages 30 with respect to the apparatus 10C for manufacturing semiconductor devices effectively.

Further, a method of manufacturing semiconductor devices 40 from the lower semiconductor packages 20 and the upper semiconductor packages 30 using the apparatus 10C for manufacturing semiconductor devices shown in FIG. 8 is the same as the method of manufacturing semiconductor devices 40 using the apparatus 10A for manufacturing semiconductor devices shown in FIG. 1, and therefore a description thereof is omitted.

For example, one in which a silicon system adhesive material is applied to a film obtained by impregnating a glass fiber cloth with polytetrafluoroethylene (PTFE) and then sintering the impregnated cloth, or the like can be utilized suitably as the heatproof adhesive sheet (adhesive material) 80 used in the present embodiment.

In this regard, the number of heatproof adhesive sheets 80 in the respective receiving portions 12 and the like are not limited to ones shown in the drawing, and they are set to appropriate values according to the size of the upper semiconductor package 30 and the like.

Next, an apparatus for manufacturing semiconductor devices and a method of manufacturing semiconductor devices using the apparatus for manufacturing semiconductor devices according to a fourth embodiment of the present invention will be described. The following description will focus on the points of difference between the first, second and third embodiments described above and the fourth embodiment, and therefore a description of the same elements is omitted.

Figure 9A:
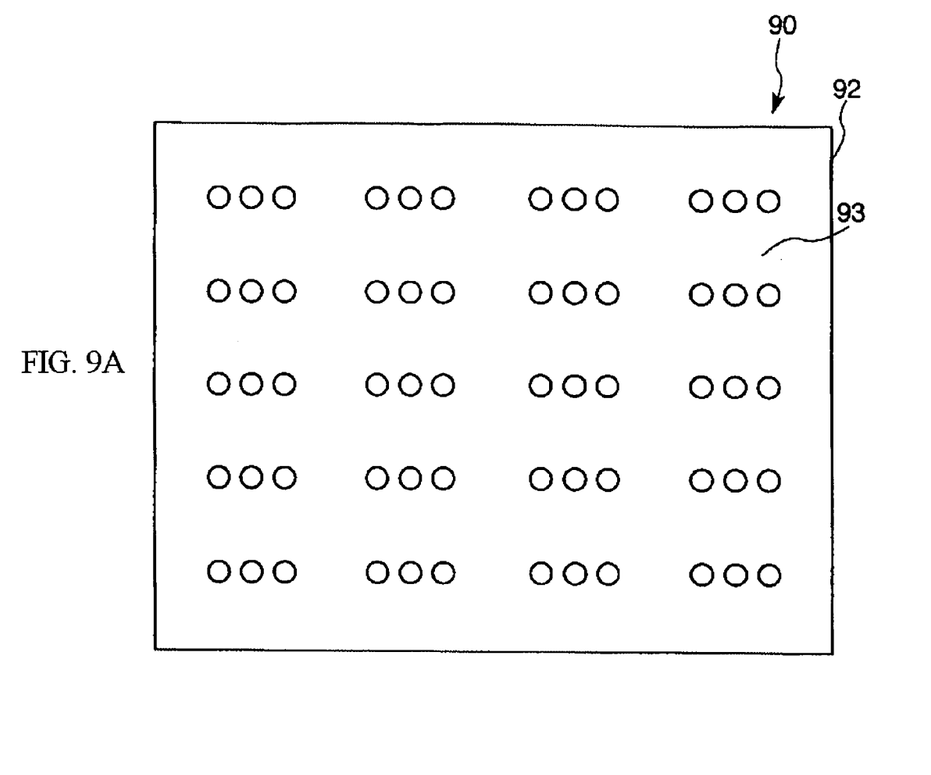
FIG. 9A is a plan view of the apparatus for manufacturing semiconductor devices.
Figure 9B:
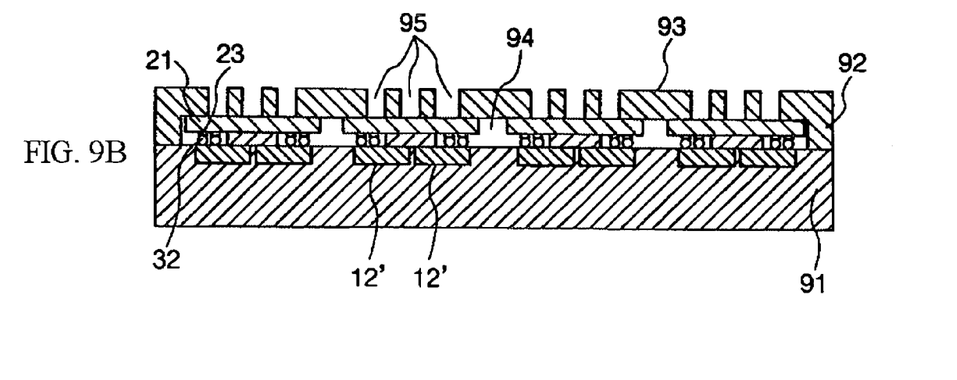
FIG. 9B is a cross-sectional view of the apparatus for manufacturing semiconductor devices.

FIG. 9 is a drawing which shows one example of a structure of an apparatus for manufacturing semiconductor devices according to a fourth embodiment of the present invention, wherein FIG. 9A is a plan view of the apparatus for manufacturing semiconductor devices, and FIG. 9B is a cross-sectional view of the apparatus for manufacturing semiconductor devices. In the description given below, the upper side in FIG. 9B is referred to as "upper", and the lower side in FIG. 9B is referred to as "lower".

First, the structure of an apparatus 90 for manufacturing semiconductor devices of the fourth embodiment will be described.

The apparatus 90 for manufacturing semiconductor devices shown in FIG. 9 includes a base 91 for manufacturing semiconductor devices that has the same structure as the apparatus 10A for manufacturing semiconductor devices shown in FIG. 1, and a base cover (pressing means) 92 arranged on the upper surface of the base 91 for manufacturing semiconductor devices.

As mentioned above, the base 91 for manufacturing semiconductor devices has substantially the same structure as the apparatus 10A for manufacturing semiconductor devices shown in FIG. 1, and includes receiving portions 12'. The shape of the receiving portion 12' in the base 91 for manufacturing semiconductor devices shown in FIG. 9, the number of receiving portions 12' in the base 91 for manufacturing semiconductor devices, the positions at which the receiving portions 12' are arranged, and the like are the same as in the apparatus 10A for manufacturing semiconductor devices shown in FIG. 1. Thus, the receiving portions 12' in the base 91 for manufacturing semiconductor devices can restrict the relative movement of the received upper semiconductor packages 30 with respect to the base 91 for manufacturing semiconductor devices effectively.

The base cover 92 is an operculiform element having a rectangular measure-shaped structure. The size of an upper surface 93 thereof is substantially the same as the size of the upper surface of the base 91 for manufacturing semiconductor devices. The base cover 92 includes a receiving space 94 for receiving the lower semiconductor packages 20 and the like therein. The base cover 92 further includes a plurality of through holes 95 in the upper surface 93 of the base cover 92 at positions corresponding to the positions of the plurality of upper semiconductor packages 30 arranged on the upper surface of the base 91 for manufacturing semiconductor devices.

When the semiconductor devices 40 are manufactured, the base cover 92 is placed on the base 91 for manufacturing semiconductor devices so as to receive the plurality of lower semiconductor packages 20 placed on the upper surface of the base 91 for manufacturing semiconductor devices with the receiving space 94 of the base cover 92. In this case, the height of the receiving space 94 is set to a slightly smaller value than the total height of the protrusion height of each of the solder balls 32 from the upper surface of the base 91 for manufacturing semiconductor devices, the thickness of each of the lands 23, and the thickness of the substrate 21. Hence, the base cover 92 presses the lower semiconductor packages 20 via the back face of the upper surface 93. This makes it possible to squash the solder balls 32 by a predetermined amount while the solder balls 32 are brought into contact with the lands 23 reliably.

Further, because the through holes 95 are arranged so as to correspond to the positions of the lower semiconductor packages 20, part of the back face of the substrate 21 is exposed to ambient air via the through holes 95. This makes it possible to raise the temperature of the lower semiconductor packages 20 at a reflow process described later efficiently because a high-temperature atmosphere inside a reflow furnace directly comes into contact with the substrate 21. As the constituent material of the base cover 92, metals having high thermal conductivity, and materials capable of emitting radiant heat such as aluminum, titanium, copper alloy, stainless steel can be utilized suitably, for example. Thus, because the thermal conductivity is improved, it is possible to reliably carry out soldering connections between the upper semiconductor packages 30 and lower semiconductor packages 20 placed on the upper surface of the base 91 for manufacturing semiconductor devices in a short time during the reflow process described later.

In the apparatus 90 for manufacturing semiconductor devices of the present embodiment, because the base cover 92 presses the lower semiconductor packages 20, it is possible to prevent the occurrence of warping of the lower semiconductor packages 20 due to the high-temperature atmosphere effectively. As a result, it is possible to further improve the reliability of connection between the upper semiconductor packages 30 and the lower semiconductor packages 20 in the obtained semiconductor device 40.

Next, a method of manufacturing semiconductor devices 40 from the lower semiconductor packages 20 and the upper semiconductor packages 30 using the apparatus 90 for manufacturing semiconductor devices will be described with reference to the drawings.

FIGS. 10A to 10E are drawings which show one example of a method of manufacturing semiconductor devices using the apparatus for manufacturing semiconductor devices shown in FIG. 9. In the description given below, the upper side in FIG. 10 is referred to as "upper", and the lower side in FIG. 10 is referred to as "lower".

Figure 10A:
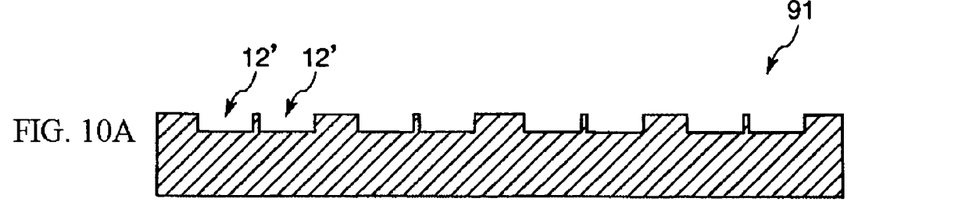
FIG. 10 is a drawing which shows a method of manufacturing semiconductor devices using the apparatus for manufacturing semiconductor devices shown in FIG. 9.

First, the base 91 for manufacturing semiconductor devices is arranged so that the surface on which the receiving portions 12' are arranged faces upward in the drawings (see FIG. 10A).

Figure 10B:
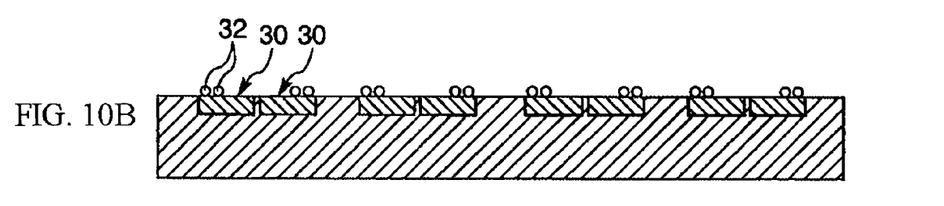

Subsequently, the upper semiconductor packages 30 are received (housed) in the plurality of receiving portions 12' on the base 91 for manufacturing semiconductor devices in a predetermined direction (see FIG. 10B).

In the fourth embodiment, at following steps the receiving portions 12' can restrict the relative movement of the received upper semiconductor packages 30 with respect to the apparatus 90 for manufacturing semiconductor devices reliably.

Figure 10C:
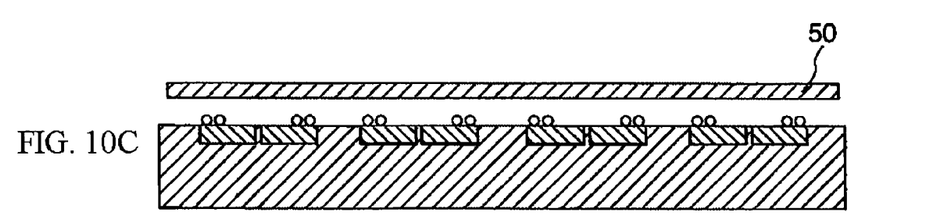
Figure 10D:
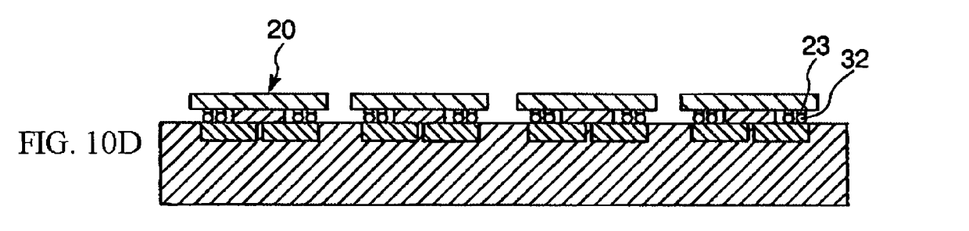
Figure 10E:
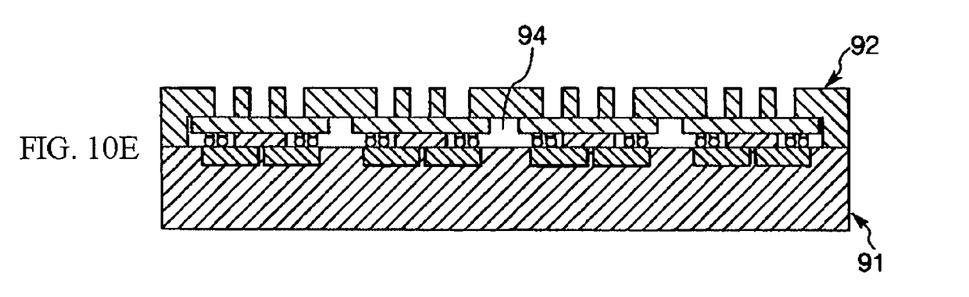

Subsequently, a flux 50 is applied to the upper surface of the base 91 for manufacturing semiconductor devices on which the plurality of upper semiconductor packages 30 are placed as well as in the first embodiment (see FIG. 10C).

On the upper surface of the base 91 for manufacturing semiconductor devices on which the flux 50 is applied, each of the plurality of lower semiconductor packages 20 is then mounted on the two corresponding upper semiconductor packages 30 so that the plurality of lands 23 of each lower semiconductor package 20 are contacted with the plurality of solder balls 32 corresponding to them. At this time, a method in which a mounter mounts the corresponding lower semiconductor package 20 on the two upper semiconductor packages 30 is the same as in the first embodiment (see FIG. 10D).

Subsequently, the base cover 92 is placed on the side of the upper surface of the base 91 for manufacturing semiconductor devices so as to receive the plurality of lower semiconductor packages 20 into the receiving space 94. Thus, because the base cover 92 presses the upper semiconductor packages 30 via the back face of the upper surface 93, it is possible to squash the solder balls 32 by a predetermined amount while the solder balls 32 are brought into contact with the lands 23 reliably (see FIG. 10E).

Subsequently, the apparatus 90 for manufacturing semiconductor devices is conveyed to the reflow furnace while the base cover 92 is placed on the upper surface of the base 91 for manufacturing semiconductor devices. At this time, because the base cover 92 presses the upper semiconductor packages 30 and the lower semiconductor packages 20, it is possible to restrict the relative movement of the upper semiconductor packages 30 and the lower semiconductor packages 20 with respect to the base 91 for manufacturing semiconductor devices more reliably. This makes it possible to prevent the occurrence of displacement of the upper semiconductor package 30 and the lower semiconductor package 20 more reliably. As a result, it is possible to further prevent the occurrence of poor soldering connections between the lower semiconductor package 20 and the upper semiconductor package 30 effectively, and to further improve the reliability of the obtained semiconductor device 40, and to suppress the manufacturing costs of the semiconductor devices 40.

Then, the upper semiconductor packages 30 and the lower semiconductor packages 20 conveyed to the inside of the reflow furnace are jointed to each other by the reflow process. The conditions for the reflow process are the same as in the first embodiment.

At this time, because the base cover 92 presses the lower semiconductor packages 20 described above, it is possible to more effectively prevent the occurrence of warping or the like of the substrate 21 caused by a high-temperature atmosphere inside the reflow furnace. As a result, it is possible to mount the lower semiconductor package 20 to the upper semiconductor packages 30 with higher accuracy, and it is possible to further prevent the occurrence of poor soldering connections between the lower semiconductor package 20 and the upper semiconductor packages 30 more effectively.

Further, because the part of the back face of the substrate 21 is exposed to ambient air via the through holes 95, the high-temperature atmosphere inside the reflow furnace directly comes into contact with the substrate 21, and this makes it possible to raise the temperature of the lower semiconductor packages 20 (that is, the solder balls 23) efficiently. As a result, it is possible to reliably carry out soldering connections between the upper semiconductor packages 30 and lower semiconductor packages 20 in a short time during the reflow process.

Then, the apparatus 90 for manufacturing semiconductor devices is removed from the reflow furnace, and the base cover 92 is removed from the base 91 for manufacturing semiconductor devices. Then, the semiconductor devices 40 are further removed from the base 91 for manufacturing semiconductor devices.

In this regard, weight of the base cover 92 may be set appropriately according to the number of lower semiconductor packages 20 to be received in the receiving space 94 and the like.

In the preset embodiment, the base 91 for manufacturing semiconductor devices has the same structure as the apparatus 10A for manufacturing semiconductor devices in the first embodiment. However, the base 91 for manufacturing semiconductor devices may have the same structure as the apparatus 10B for manufacturing semiconductor devices in the second embodiment or the apparatus 10C for manufacturing semiconductor devices in the third embodiment, for example.

Further, in addition to placing the base cover 92 on the upper surface of the base 91 for manufacturing semiconductor devices, the base cover 92 may be pressed to the base 91 for manufacturing semiconductor devices by mounting a weight on the upper surface of the base cover 92 or applying a load by an apparatus for applying a load such as a clamp.

The apparatus for manufacturing semiconductor devices, the method of manufacturing semiconductor devices and the semiconductor device according to the present invention have been described based on the embodiments shown in the drawings, but it should be noted that the present invention is not limited to these embodiments.

For example, in the embodiments described above, the number of lower semiconductor packages 20 placed on the upper surface of the apparatus 10 for manufacturing semiconductor devices or the like was described as the plural number, but the number of placed lower semiconductor packages 20 may be one.

Further, in the invention, any two or more characteristic constitutions (technical features) described in the different embodiments may be used at the same time. For example, the apparatus 10 for manufacturing semiconductor devices may be provided with the plurality of decompression holes (part of suction flow path) 60 and the plurality of heatproof adhesive sheets (adhesive material) 80 at the bottom surfaces of the respective receiving portions 12.

What is claimed is;

1. A method of manufacturing semiconductor devices, in which each semiconductor device including a substrate for mounting semiconductor components thereon and plate-shaped semiconductor components having solder balls on surfaces thereof, the plate-shaped semiconductor components being jointed to the substrate for mounting semiconductor components, the method comprising:

preparing an apparatus for manufacturing the semiconductor devices including a base having a plurality of receiving portions for receiving the semiconductor components therein while restricting movement of each of the semiconductor components in a direction parallel to a top surface of each semiconductor component;

placing the semiconductor components within the plurality of receiving portions of the base, respectively;

mounting the substrates on the semiconductor components placed within the plurality of receiving portions;

conveying the apparatus for manufacturing the semiconductor devices with the substrates inside of a reflow furnace;

subjecting the semiconductor components and the substrates to a reflow process to join the semiconductor components to the substrates; and removing the semiconductor components from the apparatus to obtain the semiconductor devices, wherein each of the plurality of receiving portions has a bottom surface, and each of the plurality of receiving portions communicates with a suction flow path for attracting the semiconductor component toward a bottom surface side of the receiving portion, wherein the method further comprises attracting the semiconductor components to the bottom surfaces of the plurality of receiving portions between the mounting step and the conveying step.

2. A method of manufacturing semiconductor devices, in which each semiconductor device including a substrate for mounting semiconductor components thereon and plate-shaped semiconductor components having solder balls on surfaces thereof, the plate-shaped semiconductor components being jointed to the substrate for mounting semiconductor components, the method comprising:

preparing an apparatus for manufacturing the semiconductor devices including a base having a plurality of receiving portions for receiving the semiconductor components therein while restricting movement of each of the semiconductor components in a direction parallel to a top surface of each semiconductor component;

placing the semiconductor components within the plurality of receiving portions of the base, respectively;

mounting the substrates on the semiconductor components placed within the plurality of receiving portions;

conveying the apparatus for manufacturing the semiconductor devices with the substrates inside of a reflow furnace;

subjecting the semiconductor components and the substrates to a reflow process to join the semiconductor components to the substrates;

removing the semiconductor components from the apparatus to obtain the semiconductor devices; and providing an adhesive material for immovably holding the semiconductor components within the plurality of receiving portions between the preparing step and the placing step.

3. A method of manufacturing semiconductor devices, in which each semiconductor device including a substrate for mounting semiconductor components thereon and a plate-shaped semiconductor components having solder balls on surfaces thereof, the plate-shaped semiconductor components being jointed to the substrate for mounting semiconductor components, the method comprising:

preparing an apparatus for manufacturing the semiconductor devices including a base having a plurality of receiving portions for receiving the semiconductor components therein while restricting movement of each of the semiconductor components in a direction parallel to a top surface of each semiconductor component;

placing the semiconductor components within the plurality of receiving portions of the base, respectively;

mounting the substrates on the semiconductor components placed within the plurality of receiving portions;

conveying the apparatus for manufacturing the semiconductor devices with the substrates inside of a reflow furnace;

subjecting the semiconductor components and the substrates to a reflow process to join the semiconductor components to the substrates;

removing the semiconductor components from the apparatus to obtain the semiconductor devices; and placing a pressing unit for pressing the substrates which are mounted on the semiconductor components between the mounting step and the conveying step, wherein the pressing unit includes a through hole at a portion corresponding to the substrates being pressed by the pressing unit placed on the base for manufacturing semiconductor devices.

* * * * *